(12) United States Patent
Hirama et al.

(10) Patent No.: US 6,576,938 B1
(45) Date of Patent: Jun. 10, 2003

(54) IMAGE SENSING ARRAY WITH SWEEP MEANS FOR SWEEPING CHARGES IN NON SELECTED REGISTERS IN THE ARRAY

(75) Inventors: Masahide Hirama, Kanagawa (JP); Katsunori Noguchi, Kanagawa (JP); Satoshi Yoshihara, Kanagawa (JP); Nishio Yoshihiro, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/704,674

(22) Filed: Nov. 3, 2000

(30) Foreign Application Priority Data

Nov. 8, 1999 (JP) .......................................... 11-317110
Nov. 30, 1999 (JP) .......................................... 11-340261

(51) Int. Cl.$^7$ ............................................ H01L 27/148
(52) U.S. Cl. ...................... 257/233; 257/215; 257/214; 257/222; 257/226; 257/228; 257/193

(58) Field of Search ............................... 237/193, 912, 237/215, 222, 226, 228, 214, 233

(56) References Cited

U.S. PATENT DOCUMENTS

| | | | | |
|---|---|---|---|---|
| 4,985,774 A | * | 1/1991 | Ishida et al. |
| 5,659,359 A | * | 8/1997 | Mochizuki et al. |
| 6,002,146 A | * | 12/1999 | Nakagawa et al. |
| 6,191,811 B1 | * | 2/2001 | Nishimura et al. |

* cited by examiner

Primary Examiner—Fetsum Abraham
(74) Attorney, Agent, or Firm—Rader, Fishman & Grauer PLLC; Ronald P. Kananen, Esq.

(57) ABSTRACT

An image input device or a solid-state image sensing device using a CCD linear sensor includes a main sensor array and a sub sensor array. A transfer register for the sub sensor array is provided with charge sweep means for sweeping away unnecessary charges. Thus, only signals in the main sensor array are selectively read out without being affected by signals in the sub sensor array.

7 Claims, 16 Drawing Sheets

IMAGE SENSING ARRAY WITH SWEEP MEANS FOR SWEEPING CHARGES IN NON SELECTED REGISTERS IN THE ARRAY

BACKGROUND OF THE INVENTION

1. Field of the Invention

The present invention relates to an image input device using a linear sensor for example, a solid-state image sensing device and a driving method thereof.

2. Description of the Background Art

As a linear sensor, a CCD linear sensor 1 according to an offset-site pick-up method as shown in FIG. 15A, for example, has been developed. The CCD linear sensor 1 includes a first sensor array (so-called main sensor array) 3 and a second sensor array (so-called sub sensor array) 4, both having a plurality of sensor portions 2 to be pixels arranged in one direction. On respective one sides of the sensor arrays 3 and 4, a first transfer register (so-called main transfer register) 7 and a second transfer register (so-called sub transfer register) 8 in a two-phase driven CCD structure, for example, are provided through reading gate portions 5 and 6, respectively.

The two sensor arrays 3 and 4 are formed shifted by half a pitch from one another, and, as shown in FIG. 15B, the distance $X_1$ between the sensor arrays 3 and 4 is an integral multiple of the pixel pitch $X_2$ ($X_1 = nX_2$ where n=integer). This is for the purpose of raising the MTF (Modulation Transfer Function).

The first and second transfer registers 7 and 8 are connected to a common transfer register portion 9 in a CCD structure to be coupled on the output portion side. Next to the final stage of the common transfer register portion 9, an output gate portion 10, and a floating diffusion region 11, for example, to serve as a charge-voltage conversion portion are provided. A reset gate portion 12 and a reset drain 13 are formed adjacent to the floating diffusion region 11. The floating diffusion region 11 is connected with an output circuit 14.

In the CCD linear sensor 1, when the maximum resolution is necessary, signal charges in the first sensor array (main sensor array) 3 and the second sensor array (sub sensor array) 4 are read out to the transfer registers 7 and 8, respectively, for transfer therein, and the signals from the first and second sensor arrays 3 and 4 are alternately outputted through the common transfer register portion 9, the floating diffusion region 11 and the output circuit 14. Then, the temporal difference between the positions of sensor portions 2 in the first sensor array 3 and sensor portions 2 in the second sensor array 4 is corrected at a signal processing portion for forming an image.

Meanwhile, when only ½ the maximum resolution is necessary for an image, signal charges in the second sensor array 4 are not necessary, and only signal charges in the first sensor array 3 are processed and outputted. In this case, the unnecessary signal charges in the second sensor array 4 are swept away to the reset drain 14 through the reset gate portion 12 via the floating diffusion region 11.

FIG. 16 shows another CCD linear sensor 16 having a different layout from the sensor array in FIGS. 15A and 15B. The CCD linear sensor 16 has a first sensor array (so-called main sensor array) 3 and a second sensor array (so-called sub sensor array) 4, both having a plurality of sensor portions 2 to be pixels arranged in one direction similarly to the above example. On respective one sides of the sensor arrays 3 and 4, a first transfer register (so-called main transfer register) 7 and a second transfer register (so-called sub transfer register) 8 in a two-phase driven CCD structure for example are provided through reading gate portions 5 and 6, respectively.

In the CCD linear sensor 16, the sensor arrays 3 and 4 are provided on the same side of the transfer registers 7 and 8, respectively. In the sensor arrays 3 and 4, before and after the regular sensor portions 2 ($S_1$ to $S_n$) and 2 ($S_1"$ to $S_n"$) to generate signal charges to form image signals, dummy sensor portions 2 ($D_1"$ to $D_n"$) and 2 ($D_{n+1}"$ to $D_m$) and dummy sensor portions 2 ($D_1"$ to $D_n"$) and 2 ($D_{n+1}"$ to $D_m$) to obtain the black reference level of an output signal are provided. The dummy sensor portions 2 ($D_1$ to $D_n$), 2 ($D_1"$ to $D_n"$) and 2 ($D_{n+1}$ to $D_m$), 2 ($D_{n+1}"$ to $D_n"$) have their upper surfaces covered with a light shielding film.

The dummy sensor portions are provided in the sensor arrays 3 and 4 in FIGS. 15A and 15B as described above.

In addition, similarly to the description in connection with FIGS. 15A and 15B, the first and second transfer registers 7 and 8 are connected to the common transfer register portion 9 in the CCD structure so as to be coupled on the output portion side. Next to the terminal end of the common transfer register portion 9, an output gate portion 10, and a floating diffusion region 11, for example, to be a charge-voltage conversion portion are formed. A reset gate portion 12 and a reset drain 13 are formed adjacent to the floating diffusion region 11. The floating diffusion region 11 is connected with the output circuit 14.

The CCD linear sensor 16 is driven similarly to the CCD linear sensor 1 shown in FIGS. 15A and 15B, as described above, and when a high resolution is necessary, signal charges in the first sensor array (main sensor array) 3 and second sensor array (sub sensor array) 4 are read out and processed to form a high resolution image. If a high resolution is not necessary, signal charges in the second sensor array 4 are not necessary, and only signal charges in the first sensor array 3 are processed for output.

In the CCD linear sensors 1 and 16, when only signal charges in the first sensor array (main sensor array) 3 are outputted, signal charges generated at the second sensor array (sub sensor array) 4 are swept away to the reset drain 13. Therefore, the signal charges must be transferred to the floating diffusion region 11, and the signals in the first sensor array 3 could be affected by the unnecessary signals in the second sensor array 4.

This is because the signals in the first sensor array 3 and the second sensor array 4 are alternately outputted and subjected to coupling at the output buffer portion (so-called output circuit portion 14). In particular, if the first sensor array 3 is in a black state, and the spatially separated second sensor array 4 changes from black to white, the signal in the first sensor array 3 subtly changes.

When a reading is performed at a high speed and a high resolution is not necessary, the frequency of a transfer clock pulse must be high, and therefore the data region is shortened, which makes signal processing at the outside difficult.

In a CCD linear sensor in which signal charges of the pixels (sensor portions) in a sensor array are allocated to a plurality of CCD transfer registers and read out, when pixels are thinned and only the signal charges of desired pixels are read out, the signal charges of the selected pixels are affected by the signal charges of the other pixels.

Meanwhile, in a CCD linear sensor such as color CCD linear sensor having a plurality of sensor arrays, if there is a reading mode to selectively read out only signal charges in a prescribed sensor array other than reading out the signal charges in all the sensor arrays, the signal charges in a non-selected array or the charges of a smear component are preferably easily swept away.

SUMMARY OF THE INVENTION

The present invention relates to the above point, and it is an object of the present invention to provide an image input device, a solid-state image sensing device, and a driving method thereof which allow selected signal charges to be unaffected by unnecessary signal charges in a non-selected transfer register or allow the unnecessary signal charges to be easily swept away at the time of reading out signal charges in a desired sensor array or desired sensor portions using a plurality of selected transfer registers, or allow high speed reading when a high resolution is not required.

The image input device according to the present invention has two or more reading modes in which signal charges in a desired sensor array or desired sensor portions can be read out using a plurality of selected transfer registers, and a transfer register not selected is provided with charge sweep means for sweeping away unnecessary charges.

In the image input device according to the present invention, with these two or more reading modes, signal charges in a desired sensor array or desired sensor portions may be selectively read out as required. Since the not-selected transfer register is provided with the charge sweep means, unnecessary charges at the non-selected transfer register (non-selected signal charges or/and charges of a smear component) are not transferred the to charge-voltage conversion portion but are swept away through the charge sweep means. Therefore, the selected signal charges are not affected by unnecessary charges.

When only signal charges in a desired sensor array or desired sensor portions are read out, high speed reading is enabled at the same driving frequency as compared to the mode of reading out all the sensor arrays or all the sensor portions, while for the same reading time, signal processing at the outside is easier for the amount reduced in the driving frequency.

The solid-state image sensing device according to the present invention has a sensor array and a plurality of transfer registers. A transfer register not selected depending upon a reading mode is provided with charge sweep means for sweeping away unnecessary charges.

In the solid-state image sensing device, the charge sweep means is provided to a plurality of transfer registers or a transfer register not selected depending upon the reading mode, and therefore unnecessary charges (non-selected signal charges or/and charges of a smear component) at the non-selected transfer register are not transferred to a charge-voltage conversion portion but are swept away through the charge sweep means. As a result, the selected signals are not affected by the unnecessary charges.

When only signal charges in a desired sensor array or desired sensor portions are read out, high speed reading is enabled at the same driving frequency as compared to the mode of reading out all the sensor arrays or all the sensor portions, while for the same reading time, signal processing at the outside is easier for the amount reduced in the driving frequency.

By a method of driving a solid-state image sensing device according to the present invention, when signal charges in a desired sensor array or desired sensor portions are read out using a plurality of selected transfer registers, unnecessary charges at a non-selected transfer register are not transferred to a charge-voltage conversion portion but are swept away.

By the driving method according to the present invention, when signal charges in a desired sensor array or desired sensor portions are selectively read out, unnecessary charges at a non-selected transfer register (non-selected signal charges or/and charges of a smear component) are not transferred to the charge-voltage conversion portion, but are swept away. Therefore, the selected signal charges are not affected by the unnecessary charges.

When only signal charges in a desired sensor array or desired sensor portions are read out, high speed reading is enabled at the same driving frequency as compared to the mode of reading out all the sensor arrays or all the sensor portions, while for the same reading time, signal processing at the outside is easier for the amount reduced in the driving frequency.

The solid-state image sensing device according to the present invention includes a plurality of sensor arrays, a plurality of transfer registers, and charge sweep means provided at each sensor array or a prescribed sensor array. The device further includes charge sweep means for sweeping away charges in a non-selected sensor array when signal charges in a desired sensor array are read out, and means for selectively turning off the reading gate portion of the non-selected sensor array.

In the solid-state image sensing device according to the present invention, when signal charges in a desired sensor array are read out, the charge sweep means for the non-selected sensor array is selected and attains a charge sweeping state. Meanwhile, the reading gate portion of the non-selected sensor array is selected and turned off. Thus, the signal charges in the non-selected sensor array are not read out to the transfer register, but are swept away to the charge sweep means. As a result, signals in the selected sensor array may be read out at a high speed without being affected by the signals in the non-selected sensor array.

When only signal charges in a desired sensor array are read out, high speed reading is enabled at the same driving frequency as compared to the mode of reading out all the sensor arrays, while for the same reading time, signal processing at the outside is easier for the reduced amount in the driving frequency.

By a method of driving a solid-state image sensing device according to the present invention, at the time of reading out signal charges in a desired sensor array among a plurality of sensor arrays, signal charges in a non-selected sensor array are not read out to the transfer register but are swept away.

By the driving method according to the present invention, signal charges in the non-selected sensor array are not read out to the transfer register but are swept away, so that signals in a selected, desired sensor array may be read out at a high speed without being affected by the signals in the non-selected sensor array.

When only signal charges in a desired sensor array are read out, high speed reading is enabled at the same driving frequency as compared to the mode of reading out all the sensor arrays or all the sensor portions, while for the same reading time, signal processing at the outside is easier for the amount reduced in the driving frequency.

BRIEF DESCRIPTION OF THE DRAWINGS

FIG. 8A is a diagram of a CCD linear sensor according to another embodiment of the present invention;

DESCRIPTION OF THE PREFERRED EMBODIMENTS

Figure 1A:
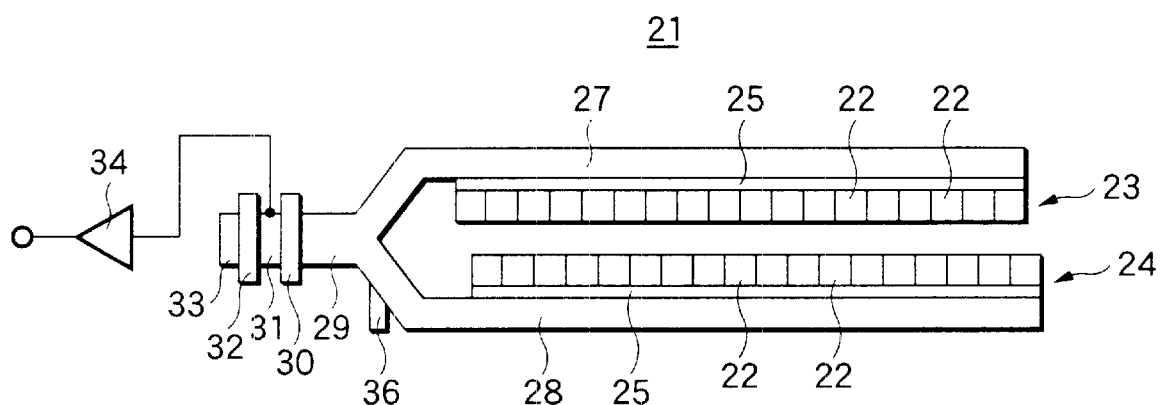
FIG. 1A is a diagram of a CCD linear sensor according to one embodiment of the present invention.

An image input device according to the present invention includes one or more sensor arrays and a plurality of transfer registers. There are two or more reading modes in which a plurality of transfer registers can be selected and signal charges in a desired sensor array or desired sensor portions can be read out. A transfer register not selected when desired signal charges are read out is provided with charge sweep means for sweeping away unnecessary signal charges.

According to the present invention, in the above image input device, the charge sweep means is provided as means for sweeping away signal charges read out to the non-selected transfer register.

A solid-state image sensing device according to the present invention includes one or more sensor arrays, and a plurality of transfer registers. A plurality of transfer registers or a transfer register not selected depending upon a reading mode is provided with charge sweep means for sweeping away unnecessary charges.

A solid-state image sensing device according to the present invention includes a main sensor array, a sub sensor array and a main register and a sub register corresponding to these sensor arrays. The main transfer register and the sub transfer register are coupled into one on the side of a charge-voltage conversion portion, and the sub transfer register is provided with charge sweep means for sweeping away unnecessary charges.

According to the present invention, in the solid-state image sensing device as described above, a linear sensor element including a sub sensor array and a sub transfer register is provided with second charge sweep means for sweeping away signal charges in the linear sensor element in a non-selected state.

The charge sweep means as described above may be formed by an overflow drain structure, electron shuttering means or the like.

By a method of driving a solid-state image sensing device according to the present invention, a plurality of transfer registers provided for one or more sensor arrays is selected to read out signal charges in a desired sensor array or desired sensor portions, and unnecessary charges at a non-selected transfer register are swept away rather than being transferred to the charge-voltage conversion portion at the time of reading out the signal charges.

By a method of driving a solid-state image sensing device according to the present invention, signal charges read out to the non-selected transfer register are swept away rather than being transferred to the charge-voltage conversion portion in the above driving method.

A solid-state image sensing device according to the present invention includes a plurality of sensor arrays, a plurality of transfer registers provided corresponding to the sensor arrays through reading gates, charge sweep means provided adjacent to the sensor arrays or a prescribed sensor array, selection means for selecting charge sweep means for a non-selected sensor array at the time of reading out signal charges in a desired sensor array and means for selectively turning off the reading gate portion of a non-selected sensor array.

Furthermore, the solid-state image sensing device is provided with a common charge-voltage conversion portion to which signal charges from a plurality of transfer registers are transferred.

By a method of driving a solid-state image sensing device according to the present invention, a plurality of transfer registers provided corresponding to a plurality of sensor arrays are selected to read signal charges in a desired sensor array, and signal charges in a non-selected sensor array are swept away rather than being read out to a transfer register at the time of reading the signal charges.

In the driving method, non-selected signal charges are preferably swept away to charge sweep means adjacent to the sensor array by turning off a reading gate portion corresponding to the non-selected sensor array.

An image input device according to the present invention includes a plurality of sensor arrays and a plurality of transfer registers. There are two or more modes in which a plurality of transfer registers can be selected to read out signal charges in all or a desired one of the sensor arrays. Signal charges in a non-selected sensor array may be swept away to charge sweep means rather than being transferred to the transfer register at the time of reading out signal charges in a desired sensor array.

Embodiments of the present invention will be now described in conjunction with the accompanying drawings.

Figure 1B:
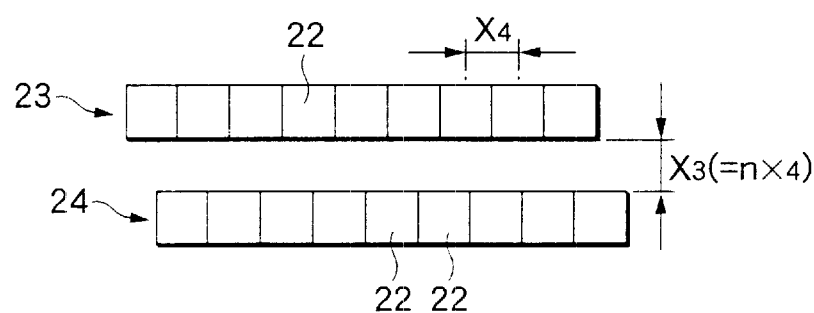
FIG. 1B is an enlarged diagram of a main part in FIG. 1A.

FIGS. 1A and 1B show a CCD linear sensor according to one embodiment of the present invention applied to an image input device, a solid-state image sensing device and the like.

The CCD linear sensor 21 according to the embodiment is an off-site, pick-up type CCD linear sensor and includes a main, first sensor array 23 and a sub, second sensor array 24 both having a plurality of sensor portion 22 to be pixels arranged in one direction. On one side of the sensor arrays 23 and 24, a main, first CCD transfer register 27 of a two-phase driven type and a sub, second CCD transfer register 28 are provided through reading gate portions 25 and 26, respectively.

The two sensor arrays 23 and 24 are formed shifted by half a pitch from one another, and as shown in FIG. 1B, the distance $X_3$ between the sensor arrays 23 and 24 is an integral multiple of the pixel pitch $X_4$ (i.e., $X_3=nX_4$, where n=integer).

The first and second CCD transfer registers 27 and 28 are connected to a common CCD transfer register portion 29 so as to be coupled on the output portion side. Provided next to the final stage of the common CCD transfer register portion 29 are an output gate portion 30 supplied with a prescribed fixed potential (ground potential for example) and a floating diffusion region or floating gate portion to serve as a charge-voltage conversion portion, a floating diffusion region 31 in the present embodiment. In addition, a reset gate portion 32 and a reset drain 33 are formed adjacent to the floating diffusion region 31. The floating diffusion region 31 is connected with an output circuit 34.

Particularly in the present embodiment, at a transfer portion near the terminal end of the second CCD transfer register 28, in other words in contact with a part of the transfer portion forming a bent transfer path close to the side of the common CCD transfer register 29, there is charge sweep means 36 for sweeping away signal charges read out to the second CCD transfer register from the second sensor array 24 before they are transferred to the floating diffusion region 31.

Figure 2:
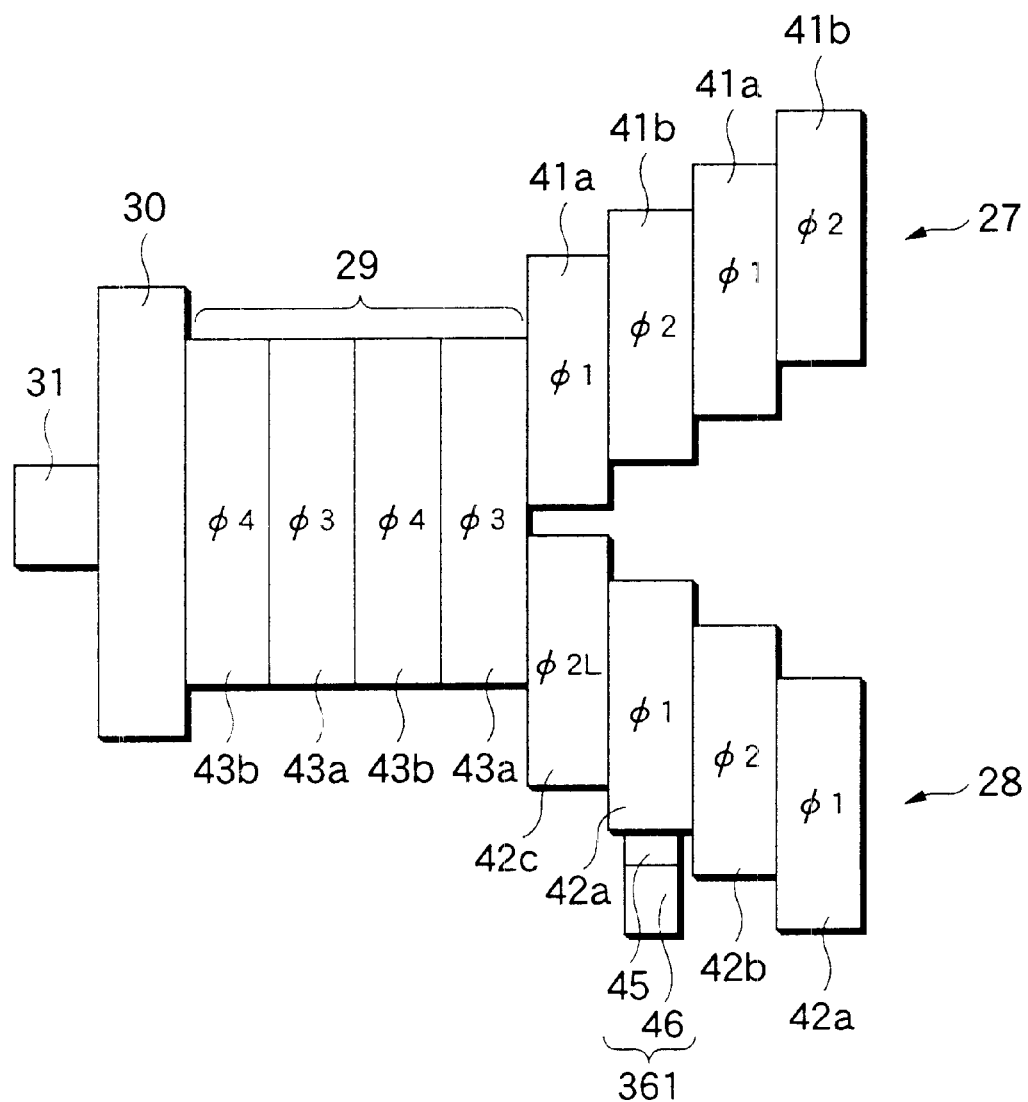
FIG. 2 is an enlarged diagram of an example of a main part of the transfer register as shown in FIG. 1A.

FIG. 2 is a diagram showing a main part of the CCD transfer register in the CCD linear sensor 21, in other words, an example of a portion to multiplex the first and second transfer registers 27 and 28.

As shown in FIG. 2, the first CCD transfer register 27 has sequentially arranged transfer portions 41a, 41b to be provided with two-phase driving pulses (clock pulses) $\phi_1$ and $\phi_2$. The transfer portion 41a to be provided with the driving pulse $\phi_1$, for example, in the final stage is provided in connection with the common CCD transfer register 29.

The second transfer register 28 has sequentially arranged transfer register portions 42a and 42b to be similarly provided with two-phase driving pulses (clock pulses) $\phi_1$ and $\phi_2$ and a transfer portion 42c to be provided with an independent driving pulse (clock pulse) $\phi_{2L}$. The transfer portion 42c is formed in connection with the common CCD transfer register portion 29 in the final stage.

The common CCD transfer register portion 29 has transfer portions 43a and 43b to be provided with two-phase driving pulses (clock pulses) $\phi_1$ and $\phi_4$. In the present embodiment, the first stage transfer portion 43a to be provided with the driving pulse $\phi_3$ is connected to the final stage transfer portions 41a and 42c to be provided with the driving pulses $\phi_1$ and $\phi_{2L}$ from the first and second CCD transfer registers 27 and 28. The transfer portion 43b in the final stage is connected to the output gate portion 30 adjacent to the floating diffusion region 31.

Charge sweep means 36 is formed next to a transfer portion of the second CCD transfer register 28 connecting to the common CCD transfer register portion 29, the transfer register portion corresponding to a so-called narrow portion, i.e., the transfer portion 42a provided with the driving pulse $\phi_1$ in the present embodiment. In the embodiment shown in FIG. 2, the charge sweep means 36 is formed by charge sweep means 361 including an overflow gate portion 45 and an overflow drain 46 provided with a prescribed fixed potential.

The operation of the CCD linear sensor 21 according to the embodiment will be now described.

In the maximum resolution mode, the first and second CCD transfer registers 27 and 28 are used to read out signal charges from the main, first sensor array 23 and the sub, second sensor array 24.

Figure 4:
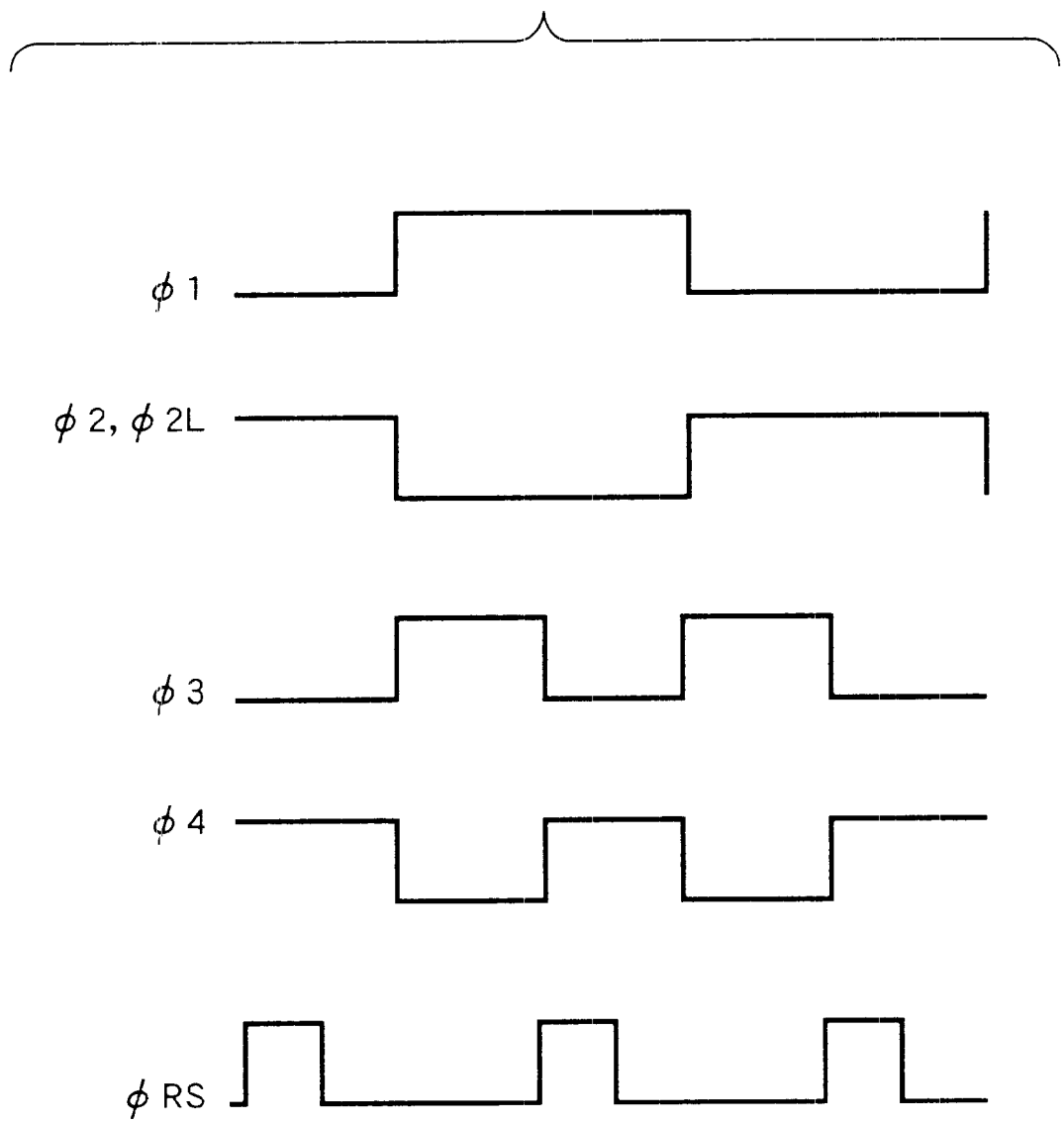
FIG. 4 is a clock timing chart in a maximum resolution mode in the CCD linear sensor in FIG. 1A.

FIG. 4 shows a clock timing in the maximum resolution mode. The driving pulse $\phi_{2L}$ applied to the final stage of the second CCD transfer register 28 is a pulse at the same clock frequency and timing as those of the driving pulse $\phi_2$.

In order to transfer signal charges in the first and second sensor arrays 23 and 24 without color mixture, the common CCD transfer register portion 29 transfers at a rate twice as high to the first and second CCD transfer registers 27 and 28. Thus, the driving pulses $\phi_3$ and $\phi_4$ have a clock frequency twice that of the driving pulses $\phi_1$, $\phi_2$, and $\phi_{2L}$.

A reset pulse $\phi_{RS}$ in synchronization with the driving pulse $\phi_4$ is applied to the reset gate 32. In the maximum resolution mode, the signal charge of each pixel in the main sensor array 23 read out to the first CCD transfer register 27 and the signal charge of each pixel in the sub sensor array 24 read out to the second CCD transfer register 28 are alternately transferred to the common CCD transfer register portion 29, and hence alternately transferred to the floating diffusion region 31 to be subjected to charge-voltage conversion for output through the output circuit 34.

In the case of the ½ resolution mode, using the first CCD transfer register 27, only signal charges in the main, first sensor array 23 are read out, while signal charges in the sub, second sensor array 24 are not read out.

Figure 5:
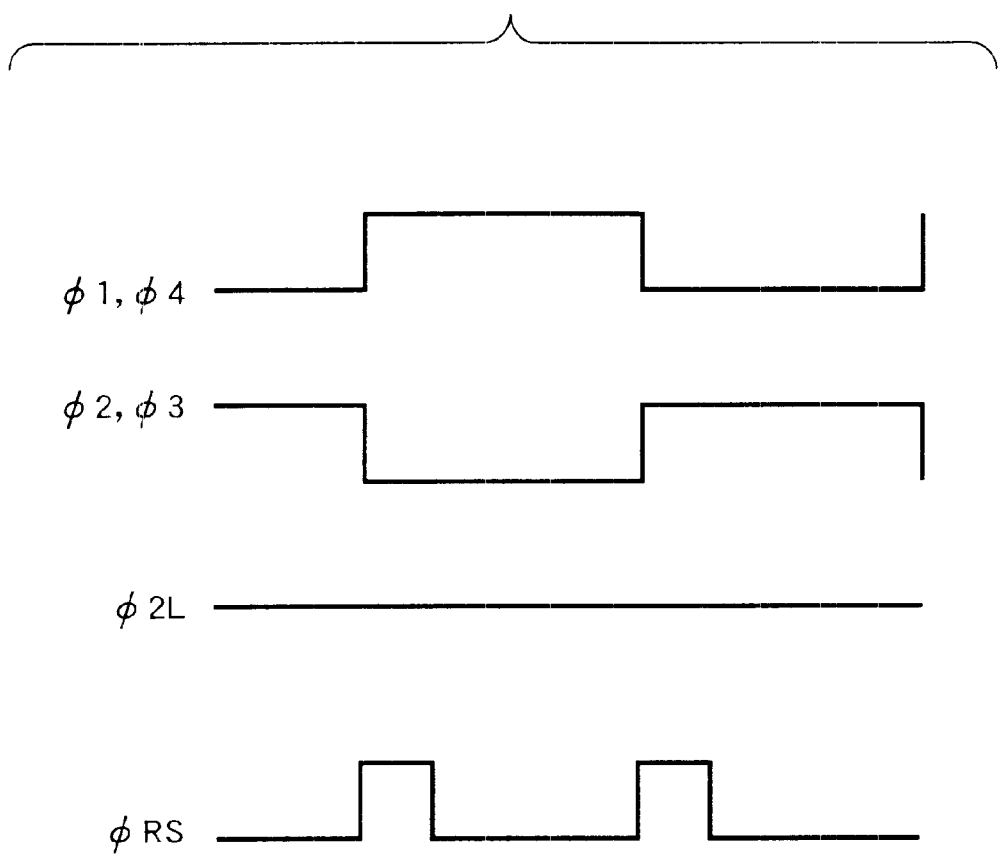
FIG. 5 is a clock timing chart in a ½ resolution mode in the CCD linear sensor in FIG. 1A

FIG. 5 is a chart showing a clock timing in the ½ resolution mode, in other words a clock timing when only the main sensor array is used.

The driving pulses $\phi_1$ and $\phi_4$ have the same clock frequency and the same timing, while the driving pulses $\phi_2$ and $\phi_3$ have the same clock frequency and the same timing.

The driving pulse $\phi_{2L}$ applied to the transfer portion 42c in the final stage of the second CCD transfer register 28 is maintained at a prescribed low level during the period in which the signal charges in the first sensor array 23 are transferred. Here, by setting the potential at the overflow gate portion 45 to be higher than the potential of the $\phi_{2L}$, electrons stored under the gate at $\phi_1$ are not transferred to the transfer portion 42c at $\phi_{2L}$ but are transferred to the overflow drain 48 through the overflow gate portion 45.

In the ½ resolution mode, only the signal charges in the main sensor array 23 are transferred to the floating diffusion region 31 through the first CCD transfer register 27 and subjected to charge-voltage conversion for output through the output circuit 34.

Meanwhile, signal charges in the sub sensor array 24 read out to the second CCD transfer register 28 are transferred in the second CCD transfer register 28, but transferred neither to the common CCD transfer register portion 29 nor to the floating diffusion region 31 and accumulated at the storage portion of the transfer portion 42c positioned in the final stage of the second CCD transfer register 28 and provided with the driving pulse $\phi_{2L}$. The succeeding signal charges are swept away to the overflow drain 46 over the overflow gate portion (overflow barrier) 45.

Note that the signal charges remaining at the transfer portion 42c are swept away to the reset drain 33 during the blanking period after pixel signals for one line in the main sensor array 23 are outputted. The signal charges may be swept away to the reset drain 33 during reading from the main sensor array 23.

Figure 3:
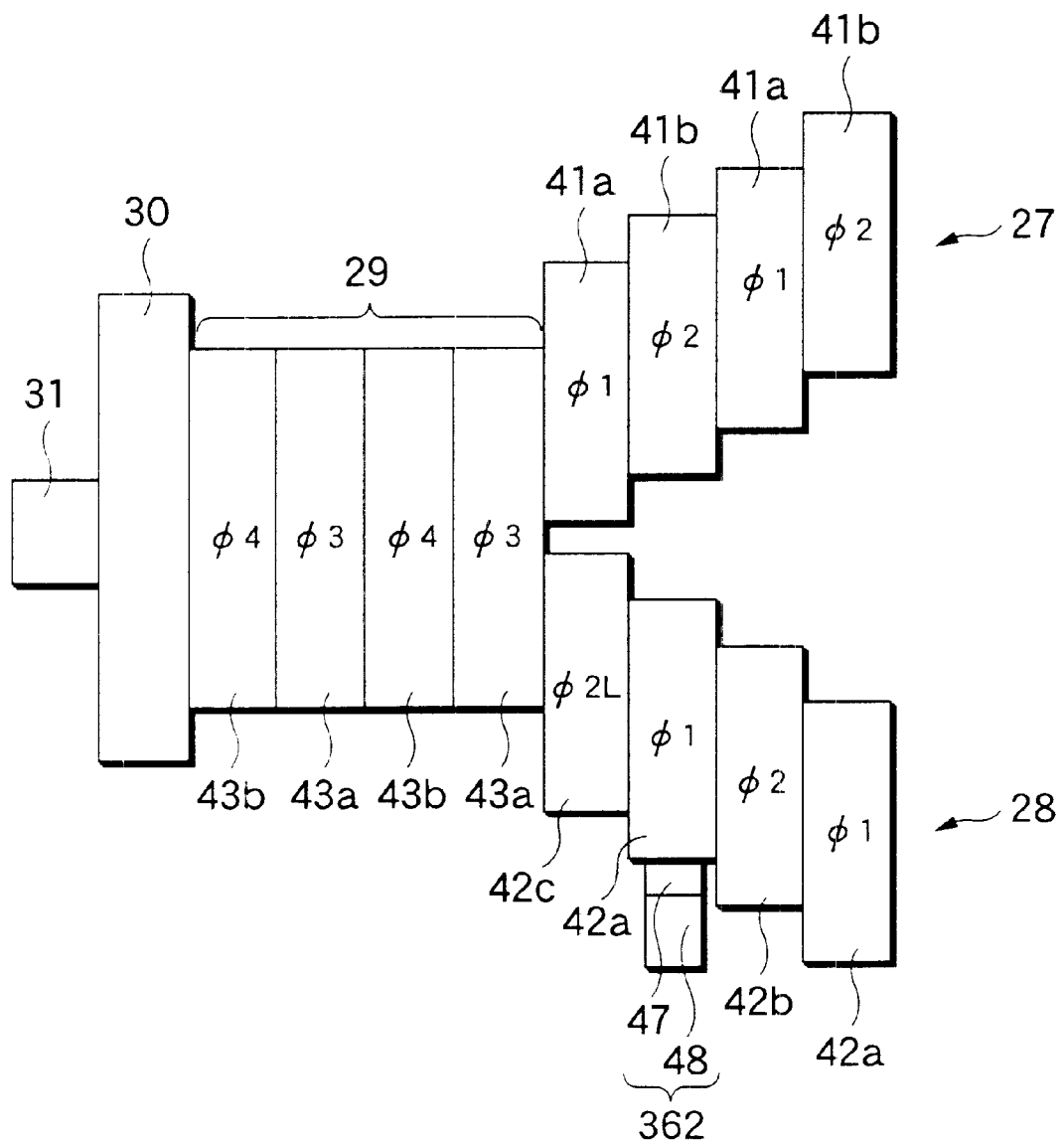
FIG. 3 is an enlarged diagram of another example of a main part of the transfer register as shown in FIG. 1A.

In the example shown in FIG. 2, the charge sweep means 361 including the overflow gate and the overflow drain is used as the charge sweep means 36, but alternatively, as shown in FIG. 3, charge sweep means 362 including a shutter structure formed by a shutter gate 45 and a shutter drain 46 may be employed. The driving pulses are the same as those in FIGS. 4 and 5.

In the maximum resolution mode, a shutter pulse to be applied to the shutter gate 45 of the charge sweep means 362 is set to a low level, and the signal charges in the main sensor array 23 and the signal charges in the sub sensor array 24 are transferred to the common CCD transfer register portion 29 through the first and second CCD transfer registers 27 and 28, respectively, so that signals from both sensor arrays 23 and 24 are outputted.

In the ½ resolution mode, the shutter pulse to be applied to the shutter gate 45 of the charge sweep means 362 is set to a high level, and the signal charges in the sub sensor array 24 read out to the second CCD transfer register 28 are swept away to the shutter drain 46 through the shutter gate 45. Then, only the signal charges in the main sensor array 23 are transferred to the floating diffusion region 31 through the first CCD transfer register 27, and subjected to charge-voltage conversion for output from the output circuit 34.

According to the CCD linear sensor 21 according to the first embodiment shown in FIGS. 1A and 1B, the maximum and ½ resolution modes may be selectively employed as a reading mode. In the ½ resolution mode, signal charges in the sub, second sensor array 24 will be swept away, but the unnecessary signal charges are swept away to the charge sweep means 36 from the transfer portion 42a near the terminal end of the second CCD transfer register 28 rather than being transferred to the floating diffusion region 31. The charge sweep means 36 sweeps away signal charges of a smear component at the second CCD transfer register 28 at the same time. Therefore, the signal charges in the main sensor array 23 will not be affected by the signal charges in the sub sensor array 24. More specifically, the signals from the main sensor array 23 will not change.

In the ½ resolution mode, signal charges in the sub sensor array 24 do not have to be transferred to the floating diffusion region 31, and therefore the clock frequency of the driving pulses $\phi_3$, $\phi_4$ is the same as that of the driving pulses $\phi_1$, $\phi_2$, which flattens the waveform.

The charge sweep means 36 is provided in connection with the transfer portion 42a at a so-called narrow portion of the second CCD transfer register 28 that is connected to the common CCD transfer register 29, in other words, it is provided in a region otherwise wasted, which increases the layout density of the linear sensor.

Note that the CCD linear sensor 21 may have a common electron shutter function, and an overflow drain function to prevent blooming.

Such a CCD linear sensor may be formed in which a main sensor array and a plurality of sub sensor arrays are formed, the terminal ends of CCD transfer registers for the main sensor array and the plurality of sub sensor arrays are connected to a common CCD transfer register, the above described charge sweep means is provided at the CCD transfer register in each sub sensor array, and signal charges in a desired sensor array may be selectively read out between signal charges in the main and sub sensor arrays. In this case, there are two or more reading modes.

Also in this case, signal charges in non-selected sub sensor arrays are swept away through the charge swept means and transferred to the floating diffusion region, and therefore the unnecessary signal charges will not affect the selected signal charges.

Note that the above embodiment is based on the offset-site pick-up method, but the arrangement of first and second sensor arrays 23 and 24 may be applied to methods other than the offset-site pick-up.

The CCD linear sensor 21 described in conjunction with FIGS. 1A and 1B has a basic structure according to the present invention in the offset-site pick-up method.

Figure 6:
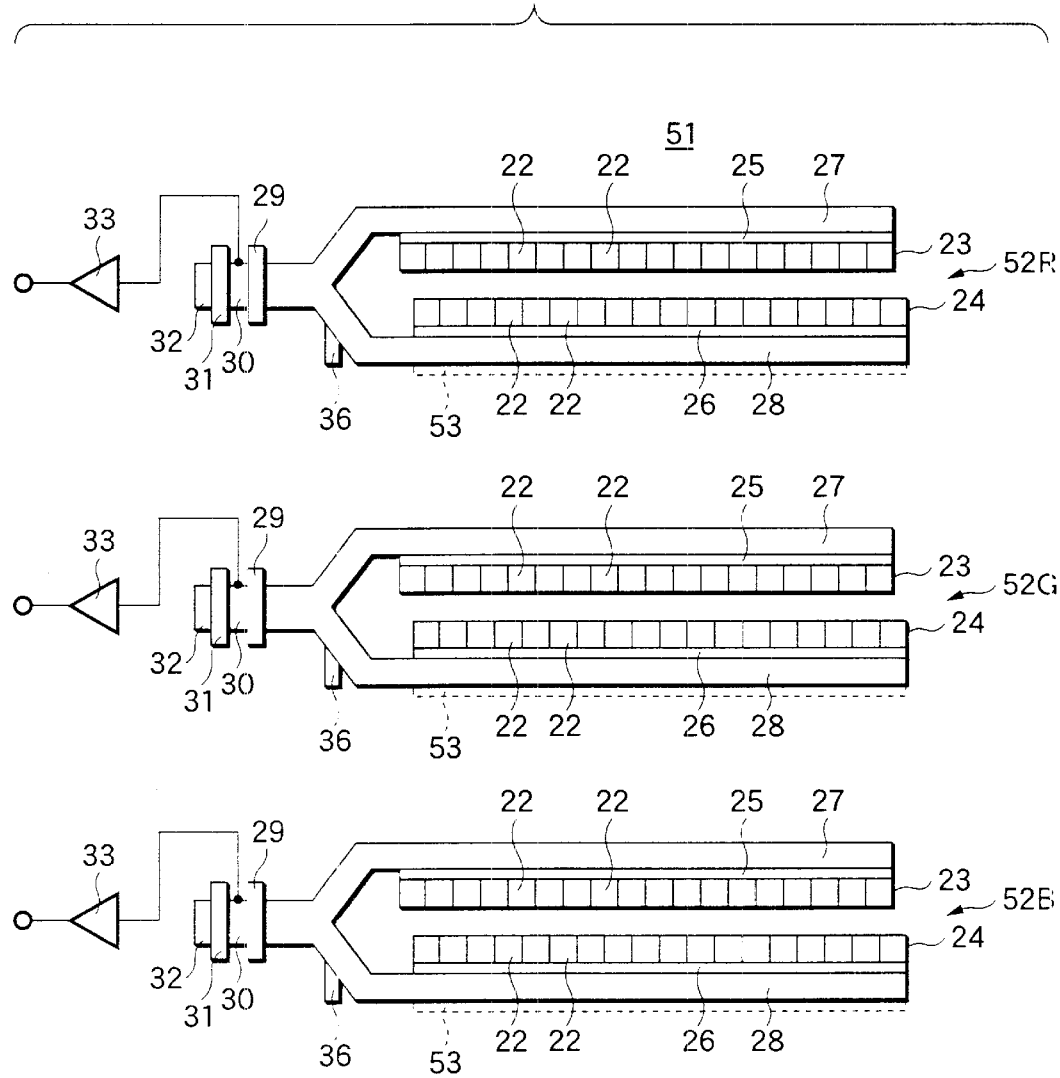
FIG. 6 is a diagram of a CCD linear sensor according to another embodiment of the present invention.

FIG. 6 shows another embodiment of the present invention in which such offset-site pick-up type CCD linear sensor, 21 is applied to a color CCD linear sensor.

The color CCD linear sensor 51 according to the embodiment includes a plurality of color linear sensors, such as R (red) linear sensor 52R, G (green) linear sensor 52G and B (blue) linear sensor 52B. Similarly to FIGS. 1A and 1B, the R linear sensor 52R, G linear sensor 52G and B linear sensor 52B each includes a main, first sensor array 23 and a sub, second sensor array 24 provided in parallel and both having a plurality of sensor portion 22 to be pixels arranged in one direction. On respective one sides of the first and second sensor arrays 23 and 24, a main, first CCD transfer register 27 and a sub, second CCD transfer register 28 of a two-phase driven type are provided through reading gate portions 25 and 26, respectively.

The first and second CCD transfer registers 27 and 28 are connected to a common CCD transfer register portion 29, and next to the final stage of the common CCD transfer register portion 29, there are an output gate portion 50, and a floating diffusion region 31 serving as a charge voltage conversion portion. Next to the floating diffusion region 31, there are a reset gate portion 32 and a reset drain 33, and an output circuit 34 is connected to the floating diffusion region 31.

Charge sweep means 36 is provided next to a transfer portion 42a at a so-called narrow portion of the second CCD transfer register 28 that is connected to the common CCD transfer register portion 29 in each of the R linear sensor 52R, the G linear sensor 52G and the B linear sensor 52B.

As the charge sweep means 36, the charge sweep means 361 of the overflow drain structure described in conjunction with FIG. 2 or the charge sweep means 362 of the shutter drain structure described in conjunction with FIG. 3 may be employed.

In the color CCD linear sensor 51 according to the embodiment, the maximum resolution mode and ½ resolution mode may be employed.

In the ½ resolution mode, signal charges in the sub sensor array 24 read out to the second CCD transfer register 28 are not transferred to the floating diffusion region 31 as described above, but are swept away to the charge sweep means 36. Thus, the signal charges in the main sensor array 23 will not be affected by the unnecessary signal charges in the sub sensor array 24.

In the color CCD linear sensor 51, a desired one of the R linear sensor 52R, the G linear sensor 52G and the B linear sensor 52B may be selectively read out.

Among the R linear sensor 52R, G linear sensor 52G and the B linear sensor 52B, a linear sensor of a desired color may be set to the ½ resolution mode while the sensors of the other colors may be set to the maximum resolution mode in reading. In other words, various other reading modes may be employed. More specifically, two or more reading modes may be employed.

In the color CCD linear sensor 51 in FIG. 6, as shown by the broken line, charge sweep means 53 of the shutter drain structure or the overflow drain structure may be provided corresponding to the region of the sensor array at the outer side of the second CCD transfer register 28.

In order to reduce the distance between adjacent color linear sensors, the charge sweep means 36 shown by the solid line on the end side of the second CCD transfer register 28 is more preferably provided.

Figure 7:
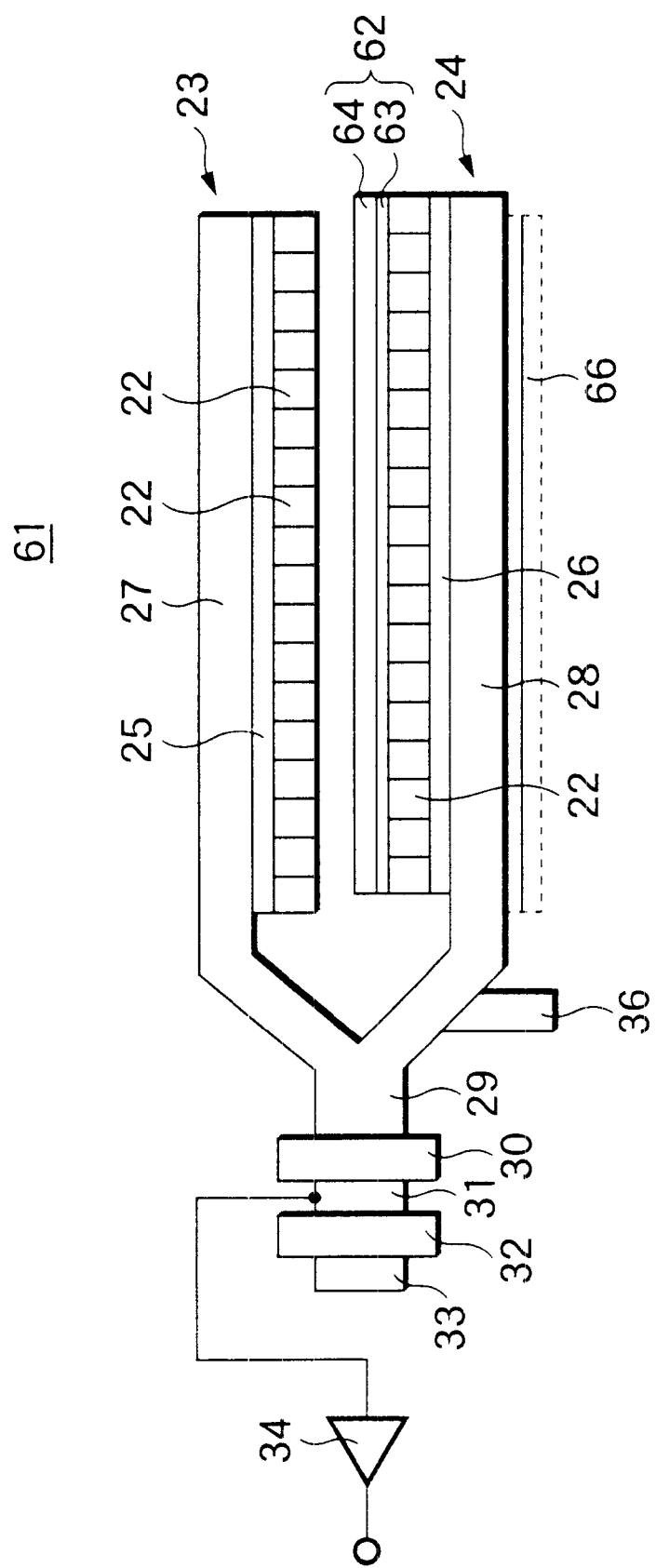
FIG. 7 is a diagram of a CCD linear sensor according to another embodiment of the present invention.

FIG. 7 shows a CCD linear sensor according to another embodiment of the present invention.

The CCD linear sensor 61 according to the embodiment represents an application to an offset-site pick-up type CCD linear sensor similar to the above case.

The CCD linear sensor 61 includes a main, first sensor array 23 and a sub, second sensor array 24, both having a plurality of sensor portion 22 to be pixels arranged in one direction. On respective one sides of the sensor arrays 23 and 24, a main, first CCD transfer register 27 and a sub, second CCD transfer register 28 of a two-phase driven type are provided through reading gate portions 25 and 26, respectively. The sensor arrays 23 and 24 are formed shifted by half a pitch from one another.

The first and second CCD transfer registers 27 and 28 are connected to a common CCD transfer register portion 29 so as to be coupled on the output portion side, and next to the final stage of the common CCD transfer register portion 29, there are an output gate portion 30 provided with a prescribed fixed potential (ground potential for example) and a floating diffusion region 31 to serve as a charge-voltage conversion portion. Next to the floating diffusion region 31, a reset gate portion 32 and a reset drain 33 are formed. The floating diffusion region 31 is connected with an output circuit 34.

In the embodiment, first charge sweep means 36 (361, 362) (see FIGS. 2 and 3) of an overflow drain structure or a shutter drain structure is formed in connection with a transfer portion 42a corresponding to a so-called narrow portion of the second CCD transfer register 28 near the common CCD transfer register portion 29 similarly to the above described embodiment. In addition, second charge sweep means 62 including a shutter gate 63 and a shutter drain 64 is formed along the length of the second sensor array 24 on the other side of the sensor array 24.

The second charge sweep means 62 is used for sweeping away unnecessary charges in the ½ resolution mode. Note that the second charge sweep means 62 may also function as so-called electron shutter means to control exposure time. In this case, though not shown, the electron shutter means to control the exposure time for the first sensor array 23 also is provided on the side of the first sensor array 23 (on the side opposing the second charge sweep means 62).

In the CCD linear sensor 61 according to the present embodiment, similarly to the above embodiment, in the maximum resolution mode, signal charges in the first and second sensor arrays 23 and 24 are transferred to the floating diffusion region 31 through the first and second transfer registers 27 and 28, and outputted through the output circuit 34.

In the ½ resolution mode, only signal charges in the first sensor array 23 are transferred to the floating diffusion region 31 and outputted through the output circuit 34, while signal charges in the second sensor array 24 are swept away rather than being transferred to the floating diffusion region 31. More specifically, in the ½ resolution mode, the unnecessary signal charges in the second sensor array 24 are swept away altogether to the second charge sweep means 62 of the shutter drain structure.

Meanwhile, in the second CCD transfer register 28, unnecessary charges to be a smear component present in the second transfer register 28 are swept away to the charge sweep means 36 during the period of reading signals from the first sensor array. The charge amount of the smear component is sufficiently insignificant as compared to the signal charge amount, and therefore the load capacity of the second transfer register 28 at the time is small.

As a result, in the CCD linear sensor 61, in the ½ resolution mode, the signal charges in the first sensor array are not affected by the smear component or the unnecessary charges, such as the signal charges in the second sensor array, so that signal fluctuation can be more surely restrained.

The other effects, as described in conjunction with FIGS. 1A and 1B are similarly provided.

Note that instead of the first charge sweep means 36, first charge sweep means 66 of the overflow drain structure or shutter drain structure could be provided along the length of the second sensor array at the outer side of the second CCD transfer register 28 as shown by the chain line. Note however that in order to increase the layout density, the charge sweep means 36 is more preferably provided.

Figure 8:
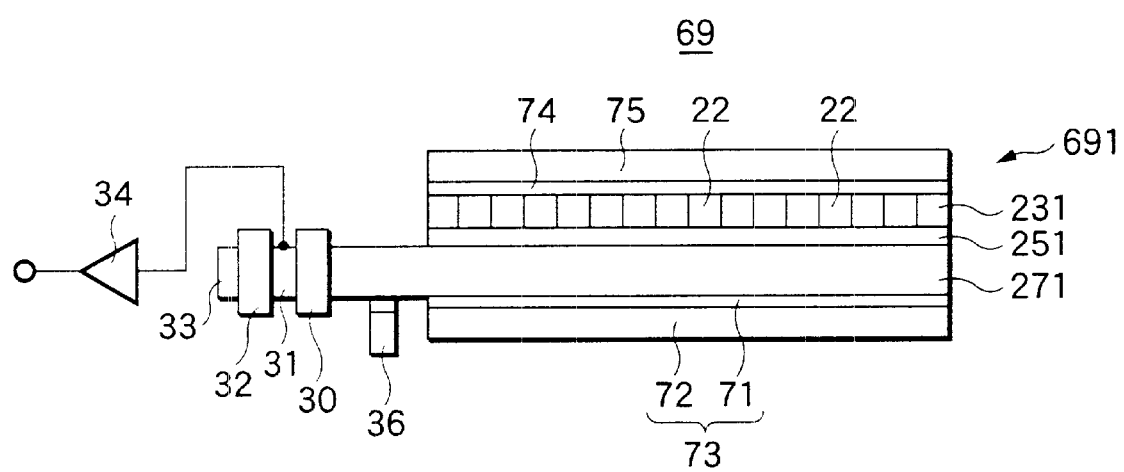
FIG. 8 is a diagram of a CCD linear sensor according to another embodiment of the present invention.

FIG. 8 shows a CCD linear sensor according to another embodiment of the present invention.

The present embodiment is an application to a CCD linear sensor having two or more linear sensor elements. FIG. 8 shows a single linear sensor.

The CCD linear sensor 69 according to the present embodiment as well as a linear sensor element 691 includes a sensor array 231 having a plurality of sensor portions 22 to be pixels arranged in one direction and a CCD transfer register 271 provided on one side of the sensor array 231 through a reading gate portion 251. An output gate portion 30 in contact with the final stage of the CCD transfer register 271, a floating diffusion region 31 to serve as a charge-voltage conversion portion, a reset gate portion 32 and a reset drain 33 are sequentially formed. The floating diffusion region 31 is connected with an output circuit 34.

In the present embodiment, first sweep means 36 is provided in contact with a transfer portion at the final stage or near the final stage of the CCD transfer register 271, while second charge sweep means 73 including, for example, a shutter gate 71 and a shutter drain 72 is provided along the length of the sensor array 231 in contact with the transfer register 271 on the same side.

On the other side of the sensor array 231, means 75, such as an overflow drain or a shutter drain, may be provided, for example, through a gate portion 74.

By the CCD linear sensor 69 according to the embodiment, all or a desired one(s) of two or more linear sensor elements 691 are selected, so that the signal charges in the selected linear sensor elements 691 are read out to the CCD transfer register 271 and outputted through the floating diffusion region 31 and the output circuit 34.

The signal charges in non-selected linear sensor elements 691 are swept away to the second sweep means 73 as soon as they are read out to the CCD transfer register 271. A smear component (charges) at the CCD transfer register 271 during the period in which the signal charges in the selected linear sensor elements 691 are transferred is swept away to the first charge sweep means 36.

Thus, the load capacity of the CCD transfer register 271 in the non-selected linear sensor elements 691 is reduced.

Three such linear sensor elements 691, as shown in FIG. 8, can be arranged as color CCD linear sensors corresponding to R (red), G (green) and B (blue).

Figure 9:
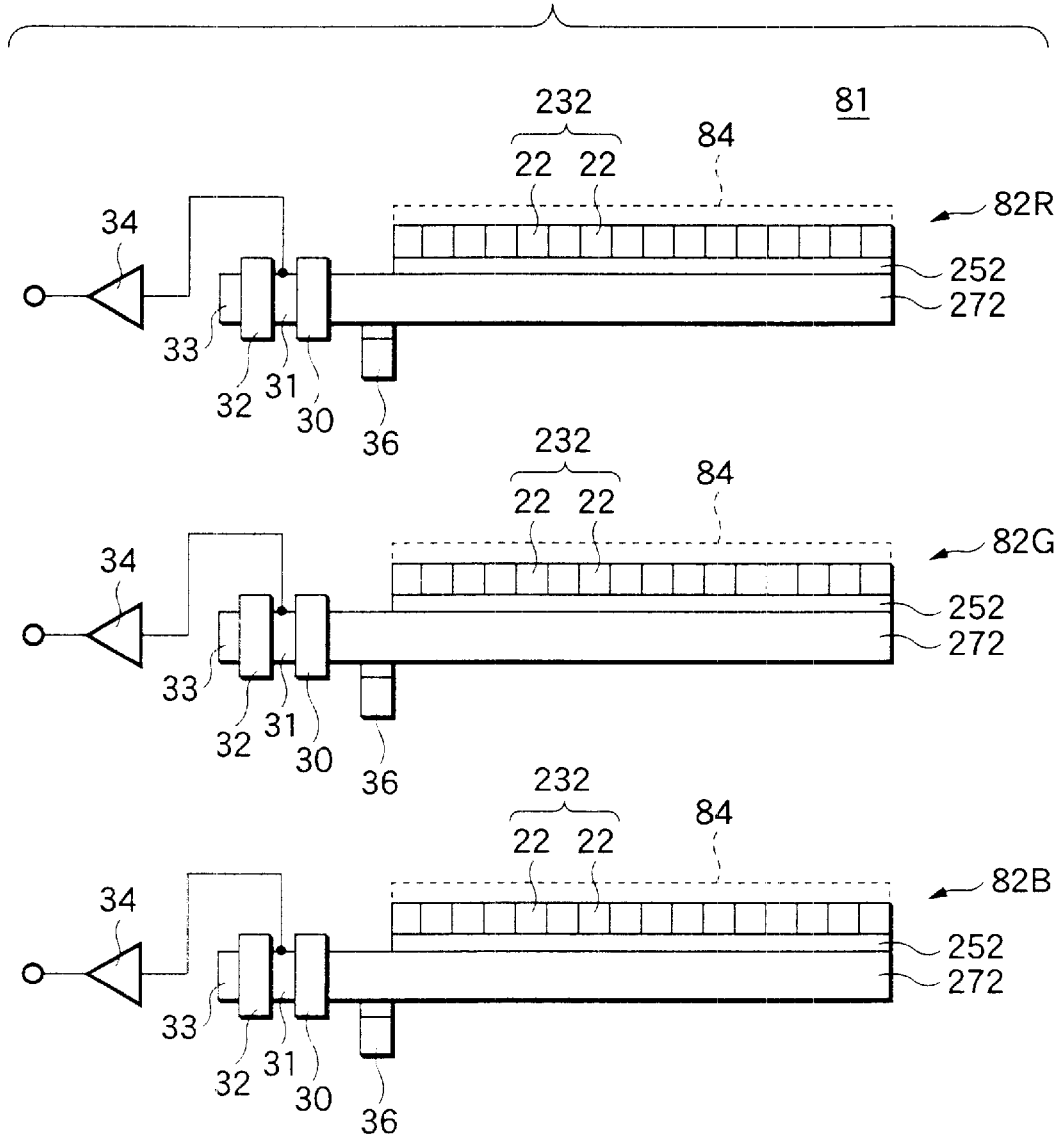
FIG. 9 is a diagram of a CCD linear sensor according to another embodiment of the present invention.

FIG. 9 shows a CCD linear sensor according to another embodiment of the present invention. The present embodiment relates to an application to a color CCD linear sensor.

The color CCD linear sensor 81 according to the embodiment includes a plurality of color linear sensors 82, e.g. an R (red) linear sensor 82R, a G (green) linear sensor 82G and a B (blue) linear sensor 82B.

The R linear sensor 82R, the G linear sensor 82G and the B linear sensor 82B each include a sensor array 232 having a plurality of sensor portions 22 to be pixels arranged in one direction and a CCD transfer register 272 provided on one side of the sensor array 232 through a reading gate portion 252. In contact with the final stage of the CCD transfer register 272, an output gate portion 30, a floating diffusion region 31 to serve as a charge-voltage conversion portion, a reset gate portion 32, and a reset drain 33 are sequentially formed and an output circuit 34 is connected to the floating diffusion region 31.

According to the embodiment, there is provided charge sweep means 36 in contact with a transfer portion at or near the final stage of the CCD transfer register 272. Electron shutter means 84 including a shutter gate portion and a shutter drain may be provided in contact with the other side of the sensor array 232.

By the color CCD linear sensor 81 according to the embodiment, among the R, G and B linear sensors 82R, 82G and 82B, all or a desired one of the color linear sensors 82 may be selected so that the signal charges in the selected linear sensor 82 are read out to the CCD transfer register 272 and outputted through the floating diffusion region 31 and the output circuit 34.

The signal charges in the non-selected color linear sensors 82 are read out to the CCD transfer register 272, then transferred in the CCD transfer register 272 and swept away to the charge sweep means 36.

If the electron shutter means 84 is provided, the signal charges in the non-selected linear sensors 82 are swept away to the electron shutter means 84, and the non-selected smear component (charges) of the CCD transfer register 272 is swept away to the charge sweep means 36. At this time, the load capacity of the CCD transfer register 271 in the unselected linear sensor element 691 is reduced.

Figure 10A:
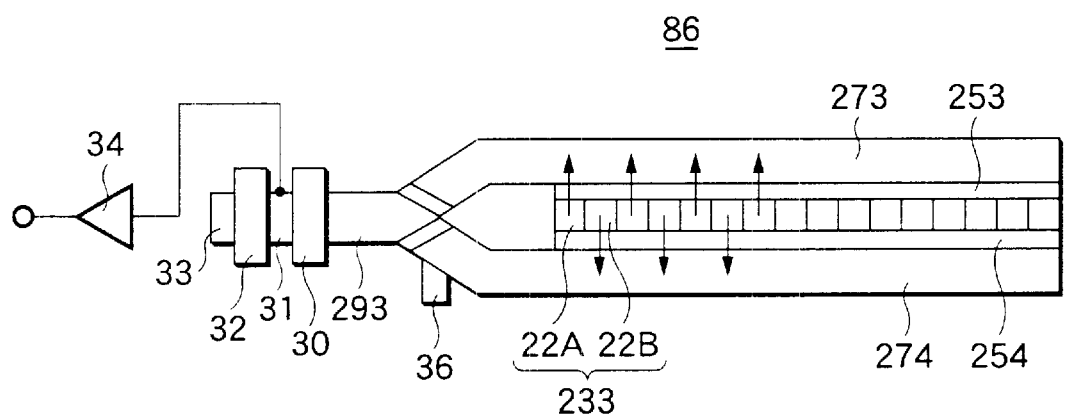
FIG. 10B is a diagram of another example of a main part of a transfer register portion.
Figure 10B:
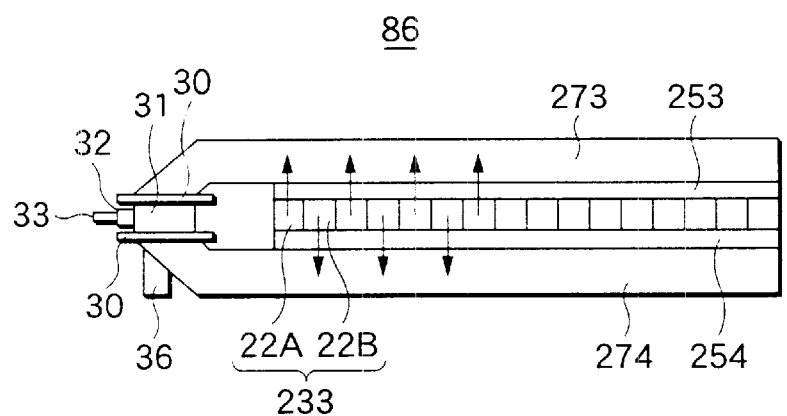

FIGS. 10A and 10B show a CCD linear sensor according to another embodiment of the present invention.

As shown in FIG. 10A, the CCD linear sensor 86 according to the embodiment includes a sensor array 233 having a plurality of sensor portions 22 (22A, 22B) to be pixels arranged in one direction, and two-phase driven, first and second CCD transfer registers 273 and 274 are arranged on the sides of the sensor array 233 through reading gate portions 253 and 254, respectively.

The first and second CCD transfer registers 273 and 274 are arranged one pitch shifted from one another.

The first and second CCD transfer registers 273 and 274 are connected to, for example, a floating diffusion region 31 to serve as a common charge-voltage conversion portion through an output gate portion 30 adjacent to a transfer portion in the final stage of the CCD transfer registers 273 and 274, respectively. In addition, a reset portion 32 and a reset drain 33 are sequentially formed, and an output circuit 34 is connected to the floating diffusion region 31.

Note that, as a multiplex portion for the CCD transfer registers 273 and 274, the arrangement as shown in FIG. 10B can be employed. Portions corresponding to those in FIG. 10A are denoted by the same reference characters and not described.

In the embodiment, similarly to the arrangements as shown in FIGS. 2 and 3, charge sweep means 36 is provided in contact with a transfer portion at or near the final stage of one CCD transfer register, the CCD transfer register 274, for example.

By the CCD linear sensor 86 according to the embodiment, the signal charges of an odd-numbered sensor portion 22A are read out to the first CCD transfer register 273, while the signal charges in an even-numbered sensor portion 22B are read out to the second transfer register 274 and then sequentially transferred to the floating diffusion region 31, in which the signal charges are converted to voltages for output through the output circuit 34.

The CCD linear sensor 86 may have such a reading mode function that only signal charges in the even sensor portion 22A are selected and read out through the first transfer register 273, and signal charges in an even-numbered sensor portion 22B are swept away.

In the reading mode, the signal charges in the non-selected even-numbered sensor portion 22B are read out to the second CCD transfer register 274 and then not transferred to the floating diffusion region 31, but they are swept away from the charge sweep means 36 in the preceding stage.

Thus, the signal charges in the odd-numbered sensor portion 22A may be outputted without being affected by the signal charge in the non-selected even-numbered sensor portion 22B. Also in this case, the signal charges in the non-selected even-numbered sensor portion 22B do not have to be transferred, and therefore the clock frequencies of the driving pulses $\phi_3$, $\phi_4$ for the common CCD transfer register 293 are the same as the clock frequencies of the signals $\phi_1$, $\phi_2$, which flattens the waveform.

Three such CCD linear sensors 86 may be arranged corresponding to R, G and B to form a color CCD linear sensor.

In the above-described embodiment, in a mode which does not require a high resolution, and only signal charges in a prescribed sensor array or sensor portions are read, high speed reading operation is enabled at the same driving pulse frequency as that in the maximum resolution mode. If the reading time is set to the same time period as that in the maximum resolution mode, the driving pulse frequency is lowered and the data region is longer, so that signals may be processed more easily at the outside.

Figure 11:
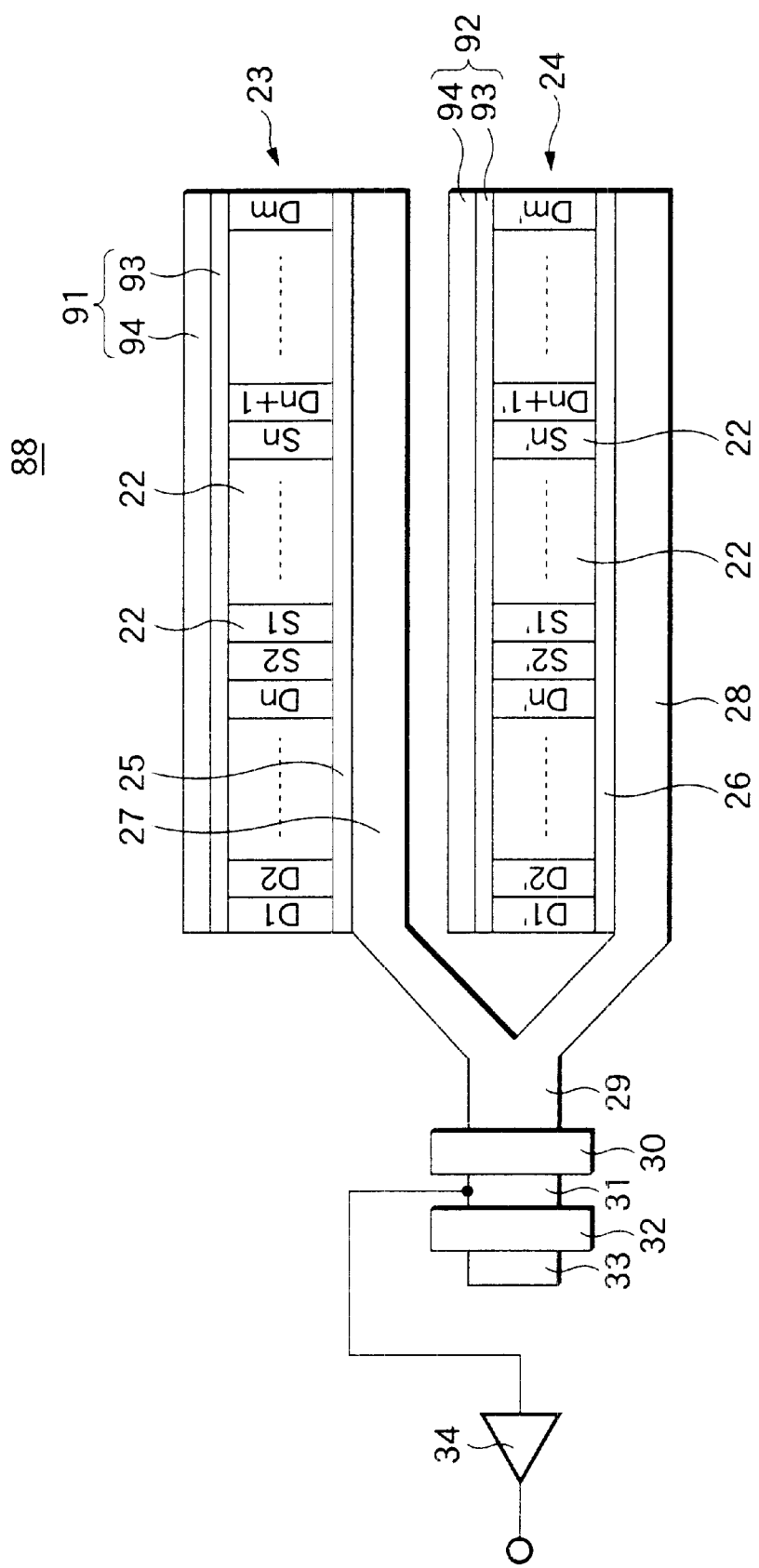
FIG. 11 is a diagram of a CCD linear sensor according to another embodiment of the present invention.

FIG. 11 shows a CCD linear sensor according to another embodiment of the present invention.

The CCD linear sensor 88 according to the embodiment includes first and second sensor arrays 23 and 24, each having a plurality of sensor portions 22 to be pixels arranged in one direction similarly to the above embodiments. Two-phase driven first and second transfer registers 27 and 28, for example, are provided on respective one sides of the sensor arrays 23 and 24 through gate portions 25 and 26, respectively.

In the present embodiment, the sensor arrays 23 and 24 are provided on the same side of the transfer registers 27 and 28, respectively. In the sensor arrays 23 and 24, before and after the regular sensor portions 22 ($S_1$ to $S_n$) and 22 ($S_1$" to $S_n$"), to generate signal charges to form image signals, dummy sensor portions 22 ($D_1$ to $D_n$) and 22 ($D_{n+1}$" to $D_m$") and dummy sensor portions 22 ($D_1$" to $D_n$") and 22 ($D_{n+1}$" to $D_m$") to obtain the black reference level of an output signal are provided. The dummy sensor portions 22 ($D_1$ to $D_n$), 22 ($D_{n+1}$ to $D_m$), 22 ($D_1$" to $D_n$"), and 22 ($D_{n+1}$" to $D_m$") have the upper surfaces covered with a light shielding film.

The sensor arrays 23 and 24 may have their pixels arranged in an offset-site pick-up method or a non-offset-site pick-up method.

The first and second CCD transfer registers 27 and 28 are connected to a common CCD transfer register portion 29 so as to be coupled on the output portion side. Next to the final stage of the common CCD transfer register portion 29, an output gate portion 30 to be provided with a prescribed fixed potential (ground potential for example), and a floating diffusion region or floating gate portion to serve as a charge-voltage conversion portion, a floating diffusion region 31 in the present embodiment are formed. In addition, a reset gate portion 32 and a reset drain 33 are formed adjacent to the floating diffusion region 31. The floating diffusion region 31 is connected with an output circuit 34.

In the embodiment, adjacent to the other side of the first and second sensor arrays 23 and 24, in other words, adjacent to the opposing side of the transfer registers 27 and 28, charge sweep means 91 and 92 are formed. The charge sweep means 91 and 92 each include a gate portion 93 and a charge sweep drain portion 94 controlled by a gate pulse.

Electron shutter means including a shutter gate and a shutter drain to control exposure time for sensor arrays for example, also may be used as the charge sweep means 91 and 92.

Meanwhile, selection means to selectively activate the charge sweep means in the non-selected sensor array 24 (or 23) when the signal charges in a desired sensor array 23 (or 24) are read out is provided.

When signal charges in the two sensor arrays 23 and 24 are read out, the charge sweep means 91 and 92 in the sensor arrays 23 and 24 are both inactivated. When only one sensor array, the first sensor array 23, for example, is selected and only its signal charges are read out, first selection means (not shown) to activate the charge sweep means 92 in the non-selected sensor array 24 is provided.

The first selection means includes pulse supply means to supply a charge sweep pulse to the gate portions 93 of the charge sweep means 91 and 92, and switching means to supply a charge sweep pulse from the pulse supply means only to the gate portion 93 of the charge sweep means 92 (or 91) in the sensor array 24 (or 23).

Furthermore, there is provided means for selectively turning off the reading gate portion 26 (or 25) in the non-selected sensor array 24 (or 23), in other words, there is provided second selection means when the signal charges in a prescribed sensor array 23 (or 24) are read out.

The second selection means supplies a reading gate pulse to the reading gate portions of both sensor arrays 23 and 24 to turn them on in order to read out signal charges in both sensor arrays 23 and 24. Meanwhile, when one sensor array 23 (or 24) is selected to read only signal charges therein, switching means to prevent a reading gate pulse from being supplied to the reading gate portion of the non-selected sensor array 24 (or 23) may be provided.

Figure 12:
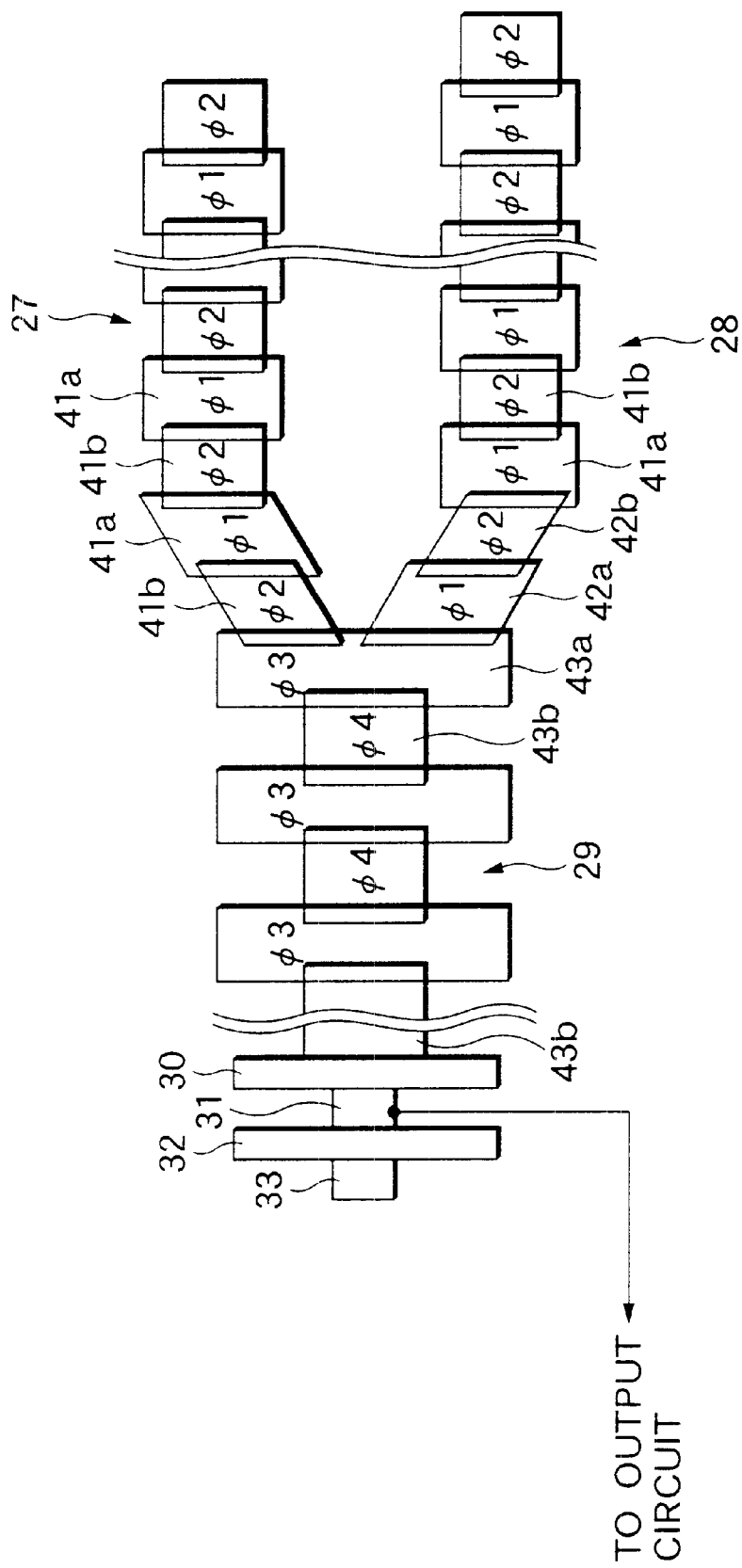
FIG. 12 is an enlarged diagram of a main part in FIG. 11.

FIG. 12 shows a main portion of the CCD transfer register in the CCD linear sensor 88, in other words, an example of a multiplexing portion for the first and second transfer registers 27 and 28.

As shown in FIG. 12, in the first CCD transfer register 27, transfer portions 41a and 41b supplied with two-phase driving pulses (clock pulses) $\phi_1$, $\phi_2$ are sequentially provided. The transfer portion 41b at the final stage supplied with the driving pulse $\phi_2$, for example, is connected to a common CCD transfer register portion 29.

Similarly, in the second CCD transfer register 28, transfer portions 42a and 42b supplied with two-phase driving pulses (clock pulses) $\phi_1$, $\phi_2$ are sequentially provided. The transfer portion 42a at the final stage supplied with the driving pulse $\phi_1$, for example, is connected to the common CCD transfer register portion 29.

In the common CCD transfer register portion 29, transfer portions 43a and 43b supplied with two-phase driving pulses (clock pulses) $\phi_1$, $\phi_4$ are arranged. In the present embodiment, the first stage, transfer portion 43a supplied with the driving pulse $\phi_3$ is connected to the transfer portions 41b and 42a at the final stage supplied with driving pulses $\phi_1$, $\phi_2$ for the first and second CCD transfer registers 27 and 28. The transfer portion 43b at the final stage is connected to the output gate portion 30 adjacent to the floating diffusion region 31.

The operation of the CCD linear sensor 88 according to the present embodiment will be described.

In the maximum resolution mode, using the first and second CCD transfer registers 27 and 28, signal charges in the first and second sensor arrays 23 and 24 are read out.

Figure 13:
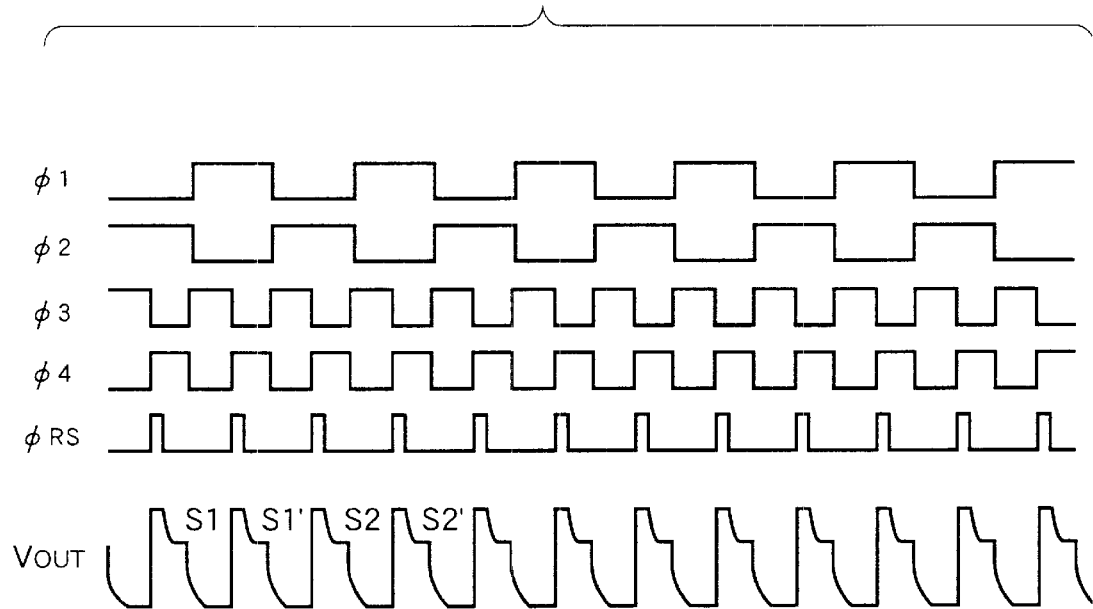
FIG. 13 is a clock timing chart in a maximum resolution mode in the CCD linear sensor in FIG. 11.

FIG. 13 is a chart showing a clock timing in the maximum resolution mode. Here, similarly to the above case described in conjunction with FIG. 4, in order to transfer signal charges in the first and second sensor arrays 23 and 24 without color mixture, the common CCD transfer register portion 29 transfers at a double speed to the first and second CCD transfer registers 27 and 28. Therefore, the driving pulses $\phi_3$, $\phi_4$ are pulses at a clock frequency twice that of the driving pulses $\phi_1$, $\phi_2$.

The reset gate 32 is provided with a reset pulse $\phi_{RS}$ in synchronization with the driving pulse 4. In the maximum resolution mode, the signal charge of each pixel in the first sensor array 23 read out to the first CCD transfer register 27 and the signal charge of each pixel in the second sensor array 24 read out to the second CCD transfer register 28 are alternately transferred to the common CCD transfer register portion 29. Therefore, they are alternately transferred to the floating diffusion region 31 as well and subjected to charge-voltage conversion, so that output signals $S_1$, $S_1''$, $S_2$, $S_2''$, ... are sequentially outputted through the output circuit.

If a high resolution is not necessary, in other words in the ½ resolution mode, only signal charges in one of the two sensor arrays 23 and 24, signal charges in the first sensor array 23 in this example, are read out using the first CCD transfer register 27. Meanwhile, signal charges in the non-selected second sensor array 24 are swept away to the charge sweep means 92 rather than being transferred to the second transfer register 28.

More specifically, a charge sweep pulse is applied to the gate portion 93 of the charge sweep means 92 in the non-selected, second sensor array 24 by the first selection means described above. The charge sweep means 92 thus attains a charge sweeping state.

A reading pulse is not applied to the reading gate portion 26 of the non-selected second sensor array 24 by the second selection means, so that the reading gate portion 26 is turned off.

As a result, the signal charges in the non-selected, second sensor array 24 are all swept away to the charge sweep means 92 rather than being transferred to the second transfer register 28.

Figure 14:
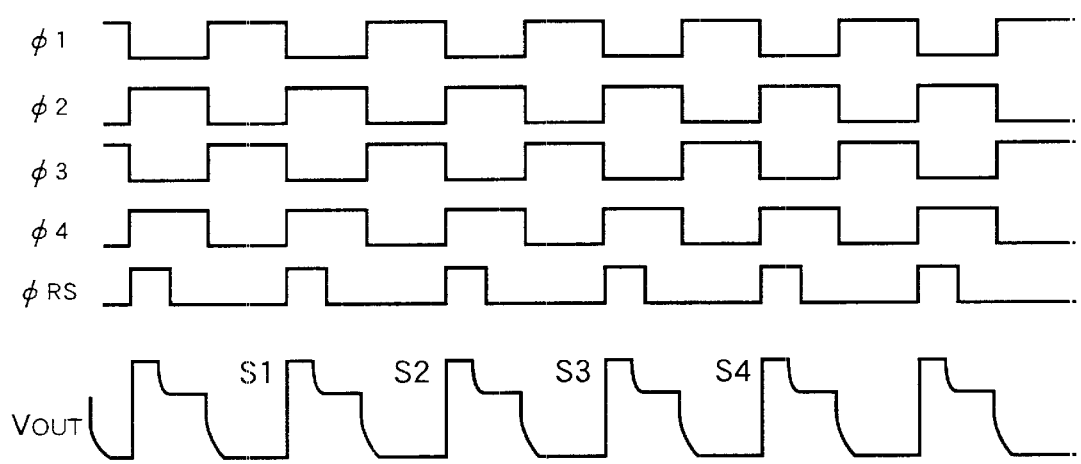
FIG. 14 is a clock timing chart in a ½ resolution mode in the CCD linear sensor as shown in FIG. 11.
Figure 15A:
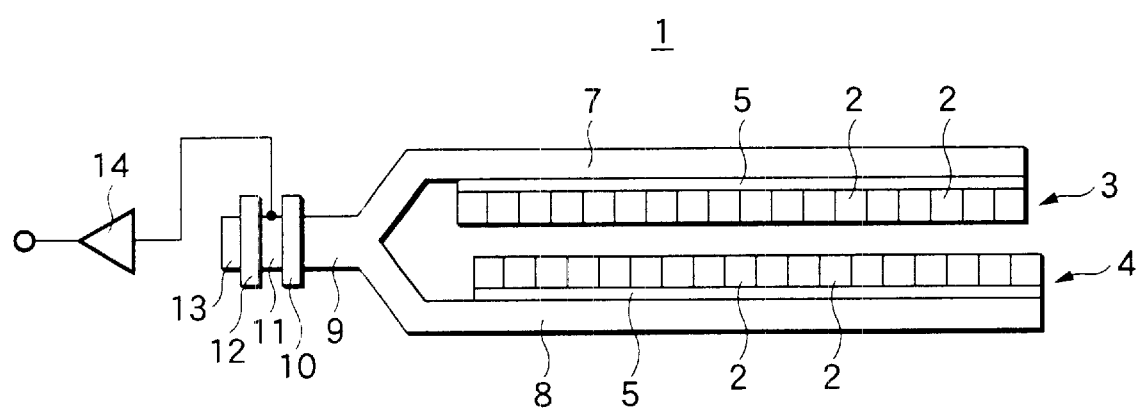
FIG. 15A is a diagram of an example of a conventional CCD linear sensor.
Figure 15B:
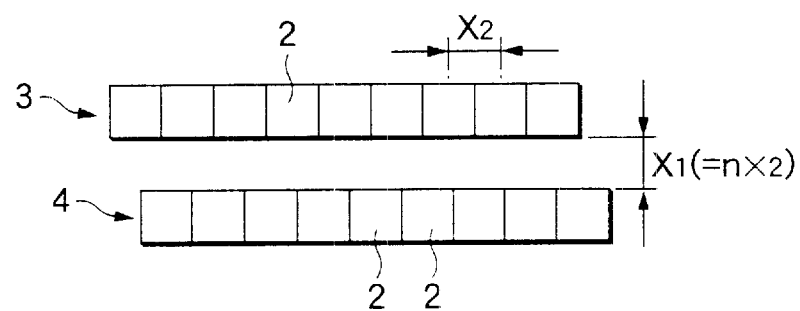
FIG. 15B is an enlarged diagram of a main part of the CCD linear sensor in FIG. 11.
Figure 16:
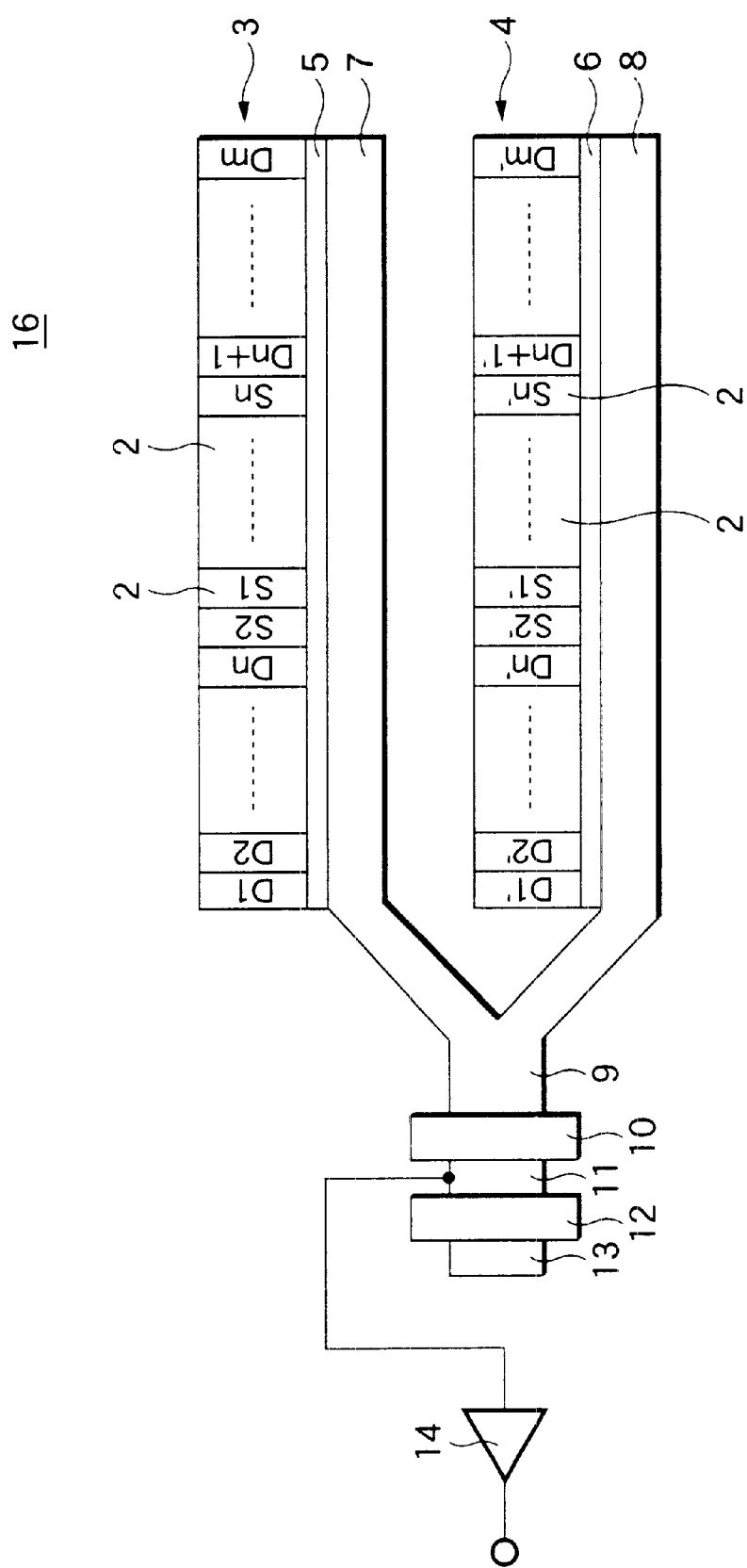
FIG. 16 is a diagram of another example of a conventional CCD linear sensor.

FIG. 14 is a chart showing a clock timing in the ½ resolution mode, in other words when only one sensor array, the first sensor array, for example, is used.

The driving pulses $\phi_1$ and $\phi_3$ are pulses at the same clock frequency and the same timing, while the driving pulses $\phi_2$ and $\phi_4$ are pulses at the same clock frequency and the same timing.

In the ½ resolution mode, using the driving pulses ($\phi_1$, $\phi_2$, $\phi_3$, $\phi_4$) at the same clock frequency as the driving pulses ($\phi_1$, $\phi_2$) in the high resolution mode, the frequency of a so-called transfer clock is unchanged, while only signal charges in a desired sensor array, the first sensor array 23, for example, are transferred to the floating diffusion region 31 through the first CCD transfer register 27. As a result, the charges may be subjected to charge-voltage conversion and outputted as output signals $S_1$, $S_2$, $S_3$, $S_4$, . . . through the output circuit 34.

By the CCD linear sensor 88 according to the present embodiment shown in FIG. 11, the reading mode may be selected between the maximum resolution mode and the ½ resolution mode. In the ½ resolution mode, signal charges in one sensor array, the second sensor array 24 are transferred neither to the second transfer register 28 nor to the floating diffusion region 31 as a result, but they are directly swept away to the charge sweep means 92. Therefore, in the ½ resolution mode, if the driving pulse frequency is set to the same frequency as the driving pulse frequency in the maximum resolution mode, reading at a high speed is enabled. If reading takes the same length of time as taken in the maximum resolution mode, the driving frequency is halved, and the data region is longer, which alleviates signal processing at the outside. The selected signal charges will not be affected by the unnecessary signal charges in the second sensor array.

The arrangement of the CCD linear sensor 88 shown in FIG. 11 may be applied to a color CCD linear sensor.

FIG. 11 shows an application to a CCD linear sensor having two linear sensor arrays, while the invention is applicable to a CCD linear sensor having three or more sensor arrays. In FIG. 11, charge sweep means is provided in all the plurality of sensor arrays, while alternatively such charge sweep means may be provided only in a prescribed sensor array (the sensor array not selected in a so-called low resolution mode).

The structure according to the present invention to sweep away the signal charges in the non-selected sensor array to the charge sweep means rather than transferring them to a transfer register may be applied to the linear sensor having a plurality of sensor arrays, as described above in conjunction with FIG. 9.

By the image input device according to the present invention, there are two or more reading modes, and unnecessary signal charges at the non-selected transfer register are swept away to the charge sweep means at the time of reading desired signal charges, so that the selected signal charges may be outputted without being affected by the unnecessary charges.

When signal charges read out to a non-selected transfer register are swept away to the charge sweep means, selected signal charges may be outputted without being affected by the non-selected signal charges. For example, when there are a main sensor array and a sub sensor array with their transfer registers connected to the same charge-voltage conversion portion, and charge sweep means is provided at the transfer register for the sub sensor array, signal charges in the non-selected sub sensor array are not transferred to the charge-voltage conversion portion, so that signal charges in the selected sensor array are not affected by the unnecessary signal charges in the non-selected sub sensor array.

Alternatively, when a plurality of transfer registers may be provided for a single sensor array with the signal charges allocated for transfer to corresponding transfer registers, and only signal charges in selected sensor portions are read out by a prescribed transfer register, the signal charges will not be affected by non-selected, unnecessary signal charges.

In order to sweep away signal charges in a non-selected sensor array altogether at a time to electron shutter or overflow drain means, the charges of a smear component generated at the non-selected transfer register are swept away to the charge sweep means, so that the selected signal charges are not affected by the charges of the smear component.

When signal charges in a desired sensor array or desired sensor portions are read out, high speed reading is enabled, which alleviate signal processing at the outside.

By the solid-state image sensing device according to the present invention, there is provided charge sweep means in a plurality of transfer registers or a non-selected transfer register, and therefore in a reading mode to selectively read a prescribed sensor array or prescribed sensor portions, unnecessary signal charges (non-selected signal charges or charges of a smear component) can be swept away through the charge sweep means rather than being transferred to the charge-voltage conversion portion. As a result, the selected signal charges are not affected by the unnecessary signal charges.

By the solid-state image sensing device according to the present invention, a main sensor array and a sub sensor array are provided with their main transfer registers and sub transfer registers being coupled together on the side of the same charge-voltage conversion portion, and the sub transfer registers are provided with charge sweep means for sweeping away unnecessary charges. As a result, the signal charges may be swept away without transferring them to the charge-voltage conversion portion, so that signal charges in the selected sensor array are not affected by the unnecessary signal charges.

When a linear sensor element including a main sensor array and a sub transfer register is provided with second charge sweep means to sweep signal charges in the linear sensor element in a non-selected state, signal charges in a non-selected sub sensor array are swept away altogether at a time to the second charge sweep means. Meanwhile, the charges of a smear component at a non-selected transfer register are swept away to the charge sweep means (first charge sweep means) provided at the transfer resister. Therefore, the load capacity of the non-selected transfer register may be reduced.

When signal charges in a desired sensor array or desired sensor portions are read out, high speed reading is enabled, which alleviates signal processing at the outside.

By a method of driving a solid-state image sensing device according to the present invention, when signal charges in a prescribed sensor array or sensor portions are selected and read out, unnecessary signal charges in a non-selected transfer register are swept away rather than being transferred to the charge-voltage conversion portion, so that the selected signal charges can be outputted without being affected by the unnecessary charges (the non-selected signal charges or/and the charges of a smear component).

When the signal charges read out to the non-selected transfer register are swept away to the charge sweep mean provided at the transfer register, the selected signal charges can be outputted without being affected by the non-selected signal charges.

When the signal charges in a prescribed sensor array or prescribed sensor arrays are read out, high speed reading is enabled, which alleviates signal processing at the outside.

By the solid-state image sensing device according to the present invention, there are a plurality of sensor arrays and charge sweep means adjacent to the plurality of sensor arrays or a prescribed sensor array. When signal charges in a desired sensor array are read out, the charge sweep means for a non-selected sensor array is selected, and the reading gate portion of the sensor array is turned off, so that the signal charges in the non-selected sensor array are swept away to the charge sweep means rather than being transferred to the transfer register. Therefore, the signals in the selected desired sensor array may be read out at a high speed without being affected by the signals in the non-selected sensor array. This also alleviates signal processing at the outside. Consequently, both high resolution reading operation and high speed reading operation which does not require a high resolution may be readily achieved.

By the solid-state image sensing device according to the present invention, a plurality of transfer registers are selected corresponding to a plurality of sensor arrays and signal charges in a desired sensor array are read out. At the time of reading the signal charges, signal charges in a non-selected sensor array are swept away rather than being read out to the transfer register, and therefore the signals in the selected desired sensor array may be read out at a high speed without being affected by the signals in the non-selected sensor array. This also alleviates signal processing at the outside.

Therefore, both high resolution reading and high speed reading which does not require a high resolution may be readily achieved.

What is claimed is:

1. An image input device, comprising:

at least one sensor array; and a plurality of transfer registers, wherein there are at least two reading modes in which said plurality of transfer register may be selected to read out signal charges in a desired sensor array or a part of the sensors in one sensor array, and said transfer register not selected at the time of reading out said signal charges is provided with charge sweep means for sweeping away unnecessary charges.

2. The image input device according to claim 1, wherein said charge sweep means is a means for sweeping away signal charges read out to the non-selected transfer register.

3. A solid-state image sensing device, comprising:

at least one sensor array; and a plurality of transfer registers, wherein said transfer register not selected depending upon a reading mode is provided with charge sweep means for sweeping away unnecessary charges.

4. A solid-state image sensing device, comprising:

a first sensor array;

a first transfer register to transfer signals in said first sensor array;

a second sensor array;

a second transfer register to transfer signals in said second sensor array; and a charge-voltage conversion portion connected in common to said first and second transfer registers, wherein at least one of said first and second transfer registers being provided with first charge sweep means for sweeping away unnecessary charges.

5. The solid-state image sensing device according to claim 4, wherein said transfer register provided with said first charge sweep means is provided with second charge sweep means.

6. A solid-state image sensing device, comprising:

a plurality of sensor arrays;

a plurality of transfer registers provided corresponding to each said sensor array through a reading gate portion;

charge sweep means provided adjacent to at least one of said plurality of sensor arrays;

selection means for selecting said charge sweep means for a non-selected sensor array when a desired sensor array is selected among said plurality of sensor arrays for reading out signal charges; and means for selectively turning off said reading gate portion in said non-selected sensor array.

7. The solid-state image sensing device according to claim 6, further comprising a common charge-voltage conversion portion to which signal charges from said plurality of transfer registers are transferred.

* * * * *